(12) United States Patent
Shakuda (10) Patent No.: US 8,411,718 B2
(45) Date of Patent: Apr. 2, 2013

(54) SEMICONDUCTOR LIGHT-EMITTING DEVICE

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 117 days.

(21) Appl. No.: 12/809,233

(22) PCT Filed: Dec. 19, 2008

(86) PCT No.: PCT/JP2008/073189
§ 371 (c)(1),
(2), (4) Date: Jun. 18, 2010

(87) PCT Pub. No.: WO2009/078482
PCT Pub. Date: Jun. 25, 2009

(65) Prior Publication Data
US 2011/0121337 A1    May 26, 2011

(30) Foreign Application Priority Data
Dec. 19, 2007 (JP) ............................. P2007-327927

(51) Int. Cl.
*H01S 5/323* (2006.01)
*H01S 5/22* (2006.01)

(52) U.S. Cl. ............ 372/50.1; 257/98; 257/99; 438/31; 438/40

(58) Field of Classification Search ............ 257/79, 257/98, E33.001, E33.005, E33.023, 99, 257/918, E33.062, E33.065; 438/22, 29; 372/41, 43.01, 44.01, 50.124
See application file for complete search history.

(56) References Cited

U.S. PATENT DOCUMENTS

| | | | |
|---|---|---|---|
| 5,394,421 A | | 2/1995 | Ikawa et al. |
| 5,932,896 A | * | 8/1999 | Sugiura et al. ............ 257/94 |
| 6,420,731 B1 | * | 7/2002 | Katayama et al. ............ 257/79 |
| 7,986,722 B2 | * | 7/2011 | Higuchi et al. ............ 372/50.124 |
| 2001/0011730 A1 | | 8/2001 | Saeki |
| 2003/0026307 A1 | | 2/2003 | Makita et al. |
| 2004/0245540 A1 | | 12/2004 | Hata et al. |
| 2005/0279994 A1 | | 12/2005 | Ueda et al. |

FOREIGN PATENT DOCUMENTS

| | | |
|---|---|---|
| CN | 1519998 A | 8/2004 |
| EP | 0 322 847 | 7/1989 |
| EP | 1 291 989 A1 | 3/2003 |
| JP | 04-103187 A | 4/1992 |
| JP | 07-030194 A | 1/1995 |

(Continued)

*Primary Examiner* — Olik Chaudhuri
*Assistant Examiner* — Quovaunda V Jefferson
(74) *Attorney, Agent, or Firm* — Rabin & Berdo, P.C.

(57) ABSTRACT

The present invention provides a nitride semiconductor light-emitting device capable of preventing shortening of the device lifetime due to increase in the driving voltage of the device and internal heat generation, and also providing uniform laser characteristics, even if the device has a ridge stripe structure. On a GaN substrate 1, an n-type GaN layer 2, an n-type AlGaN layer 3, an active layer 4, a p-type AlGan layer 5 and a p-type GaN layer 6 are laminated sequentially. On the p-type GaN layer 6, an insulating film 7 and a transparent electrode 8 are formed. A portion of the transparent electrode 8 is formed in contact with the p-type GaN layer 6. A ridge stripe portion D to form a waveguide is configured of a transparent film 9. A region, where the transparent electrode 8 and the p-type GaN layer 6 are in contact with each other, serves as a stripe-shaped current injection region.

9 Claims, 8 Drawing Sheets

FOREIGN PATENT DOCUMENTS

| | | |
|---|---|---|
| JP | 10-256657 A | 9/1998 |
| JP | 11-214788 A | 8/1999 |
| JP | 2002-204031 A | 7/2002 |
| JP | 2004-048080 A | 2/2004 |
| JP | 2006-041491 A | 2/2006 |
| WO | WO-2006/134717 A1 | 12/2006 |

* cited by examiner

SEMICONDUCTOR LIGHT-EMITTING DEVICE

TECHNICAL FIELD

The present invention relates to a semiconductor light-emitting device having a ridge stripe structure.

BACKGROUND ART

As an example of a conventional semiconductor light-emitting device having a ridge stripe structure, a ridge waveguide semiconductor is fabricated. This semiconductor light-emitting device generally has a double heterostructure in which an active layer is provided between an n-type cladding layer and a p-type cladding layer, a portion of the p-type cladding layer being etched to form a ridge stripe portion (refer to patent documents 1, 2 and 3, for example).

Figure 12:
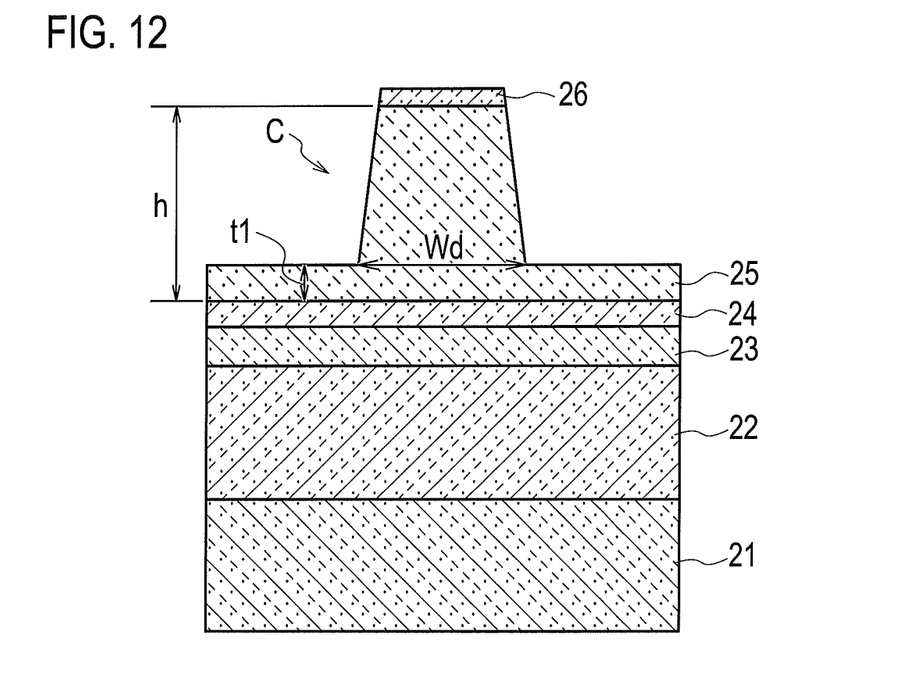
FIG. 12 is a drawing showing a cross section structure of a nitride semiconductor light-emitting device having a conventional ridge stripe structure.

For example, a ridge waveguide type semiconductor laser device composed of nitride is fabricated by sequentially laminating an n-type GaN layer 22, an n-type AlGaN layer 23, an active layer 24, and a p-type AlGaN layer 25 on a conductive substrate 21 as shown in FIG. 12, in which a portion of the p-type AlGaN layer 25 is etched by dry etching to form a ridge stripe portion C with a convex shape. A p-type GaN layer 26 is formed on top of the ridge stripe portion C.

The semiconductor laser device having such structure includes a ridge stripe portion C to form an optical waveguide. The ridge stripe portion C contributes to lateral light confinement and current constriction in the active layer 24. Light is confined by use of the effective refractive index difference between a region in the active layer 24 corresponding to the transverse width Wd at the bottom of the ridge stripe portion C and regions in the active layer 24 at both sides of the region corresponding to the width Wd. The effective refractive index difference is dependent on a film thickness t1 of a flat portion of the mesa-etched p-type AlGaN layer and is a factor determining the oscillation wavelength characteristics (spectral characteristics). Accordingly, it is important to precisely control the thickness t1.

Patent Document 1: Japanese Patent Application Publication No. 2002-204031
Patent Document 2: Japanese Patent Application Publication No. Hei 11-214788
Patent Document 3: Japanese Patent Application Publication No. Hei 10-256657

DISCLOSURE OF THE INVENTION

Problems to be Solved by the Invention

In the prior art described above, a ridge stripe structure is formed by dry etching a GaN-based semiconductor such as a p-type AlGaN. However, the film thickness t1 cannot be controlled precisely by dry etching. Specifically, for example, it is difficult to make the film thickness t1 uniform inside a region of 10 μm×1000 μm (a device) or 10 mm×10 mm (small wafer area). Accordingly, laser characteristics, especially oscillation wavelength characteristics, vary among devices.

Furthermore, to cause the p-type AlGaN forming the ridge stripe portion to exert its role as a longitudinal cladding layer and control the effective refractive index difference by the value of the film thickness t1, the film thickness h of the unprocessed p-type AlGaN layer 25 is needed to be 1 μm or more. However, there has been a problem that increasing the film thickness of a p-type semiconductor layer such as a p-type AlGaN raises resistance, thereby increasing the driving voltage and internally generating heat to shorten the device lifetime.

The present invention is made to solve the problems described above and is intended to provide a semiconductor light-emitting device capable of preventing shortening of the device lifetime due to increase in the driving voltage and internal heat generation, and also providing uniform laser characteristics, even if the device has a ridge stripe structure.

Means for Solving the Problems

In order to solve the above problems, the invention as recited in claim 1 provides a semiconductor light-emitting device including; a laminated structure in which an active layer is disposed between one of p-type semiconductor layers and an n-type semiconductor layer; a transparent electrode formed on an outermost semiconductor layer of the p-type semiconductor layers; and a ridge stripe portion formed on the transparent electrode and configured to form an optical waveguide. The transparent electrode and the ridge stripe portion are transparent with respect to the emission wavelength of the active layer.

The invention as recited in claim 2 is the semiconductor light-emitting device as recited in claim 1, wherein the p-type semiconductor layers, the n-type semiconductor layer and the active layer are made of nitride.

The invention as recited in claim 3 is the semiconductor light-emitting device as recited in any one of claim 1 and claim 2, wherein the ridge stripe portion is made of the same material as the transparent electrode.

The invention as recited in claim 4 is the semiconductor light-emitting device as recited in any one of claim 1 to claim 3, wherein a region of the transparent electrode in contact with the p-type semiconductor layer is limited by an insulating film.

The invention as recited in claim 5 is the semiconductor light-emitting device as recited in any one of claim 1 to claim 4, wherein maximum transverse width W1 of the ridge stripe portion and traverse width W2 of the contact surface between the transparent electrode and the p-type semiconductor layer satisfies the relationship of $W1 \geq W2$.

The invention as recited in claim 6 is the semiconductor light-emitting device as recited in any one of claim 1 to claim 5, wherein a p-type electrode is formed in contact with at least a portion of one of surfaces of the transparent electrode exposed on both sides of the ridge stripe portion.

The invention as recited in claim 7 is the semiconductor light-emitting device as recited in claim 6, wherein the p-type electrode is formed in contact with the entire exposed surfaces of the transparent electrode.

The invention as recited in claim 8 is the semiconductor light-emitting device as recited in any one of claim 1 to claim 7, wherein the transparent electrode is formed inward of an edge surface of the optical waveguide.

Effect of the Invention

According to the present invention, a ridge stripe portion to form the optical waveguide is formed by a transparent insulating film which is formed on an outermost semiconductor layer of the p-type semiconductor layers through a transparent electrode. For this reason, the p-type semiconductor layer need not be etched to form a ridge stripe shape by dry etching, and fluctuation of laser characteristics can be prevented.

Furthermore, since there is no need to process the p-type semiconductor layer to form the waveguide, the p-type semiconductor layer can be formed thinly so that shortening of the device lifetime due to increase of the driving voltage and internal heat generation can be prevented.

DESCRIPTION OF REFERENCE NUMERALS

1 GaN substrate
2 n-type GaN layer
3 n-type AlGaN layer
4 active layer
5 p-type AlGaN layer
6 p-type GaN layer
7 insulating film
8 transparent electrode
9 transparent film
10 p-type electrode
11 n-type electrode
16 p-type GaN layer
17 n-type GaN layer
18 transparent electrode

BEST MODE FOR CARRYING OUT THE INVENTION

Figure 1:
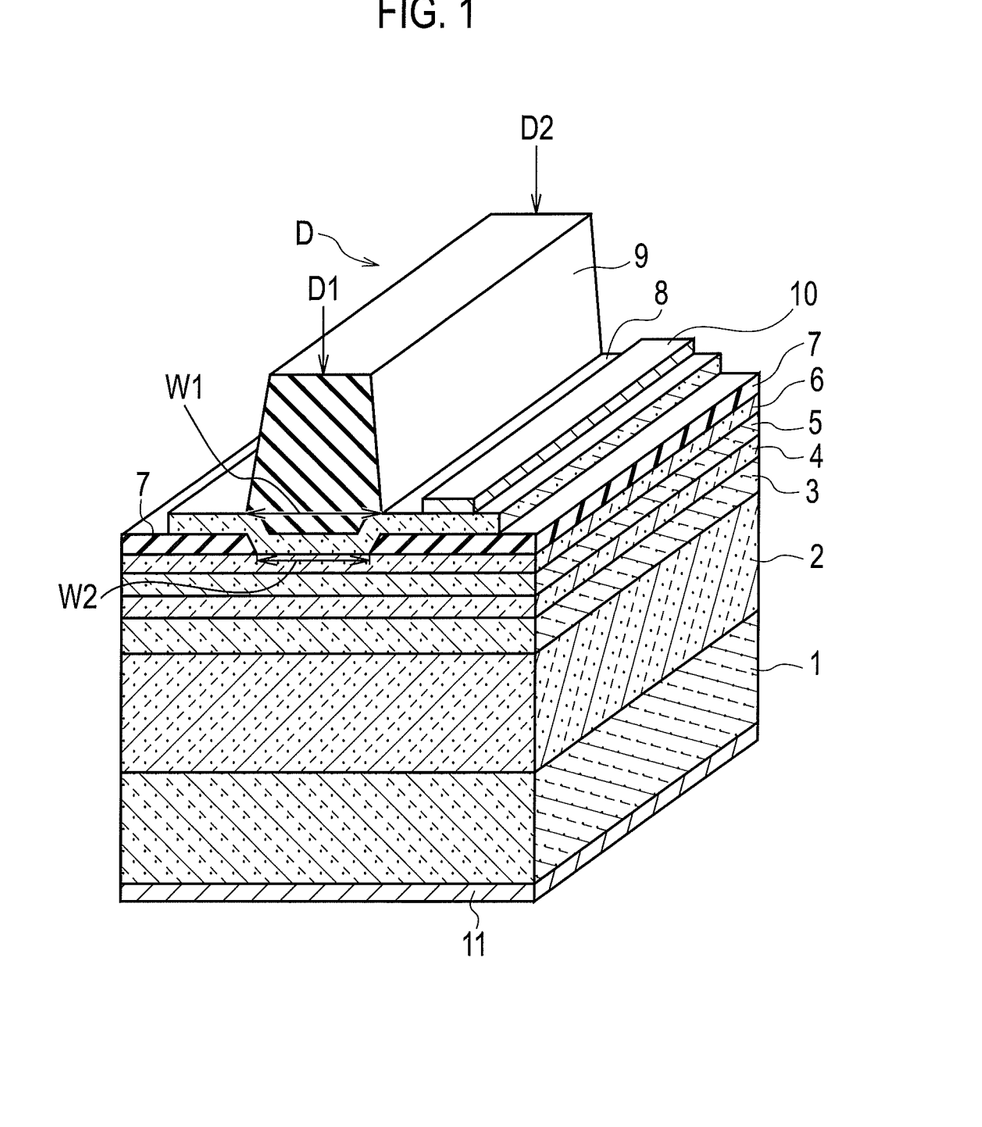
FIG. 1 is a perspective view showing an entire structure of a semiconductor light-emitting device according to the present invention.

Hereinafter, an embodiment according to the present invention is described by referring to drawings. FIG. 1 shows a cross section structure of a nitride semiconductor laser device as an example of the semiconductor light-emitting device according to the present invention.

Nitride semiconductors composing a nitride semiconductor laser device are fabricated by the known MOCVD method or the like. Here, the nitride semiconductors represent the quaternary AlGaInN (so-called "Group III-V nitride semiconductors), which can be expressed with $Al_xGa_yIn_zN$ ($x+y+z=1$, $0 \leq x \leq 1$, $0 \leq y \leq 1$, $0 \leq z \leq 1$). A GaN-based semiconductor is a semiconductor including GaN only or a semiconductor containing GaN as a constituent material, expressed with $0 < y \leq 1$ in the above formula of quaternary AlGaInN.

On top of a GaN substrate 1, an n-type GaN layer 2, an n-type AlGaN layer 3, an active layer 4, a p-type AlGaN layer 5 and a p-type GaN layer 6 are laminated sequentially. On top of the p-type GaN layer 6, a structure made of a material other than materials of nitride semiconductors is formed. More particularly, an insulating film 7 and a transparent electrode 8 are formed on the p-type GaN layer 6. The insulating film 7 is formed in contact with the upper surface of the p-type GaN layer 6, except for a region corresponding to a raised ridge stripe portion D. On the other hand, the transparent electrode 8 is formed in contact with the p-type GaN layer 6, only at a region corresponding to the ridge stripe portion D. Except for a region which is in contact with the p-type GaN layer 6, the transparent electrode 8 is formed on the insulating film 7. A region, where the transparent electrode 8 and the p-type GaN layer 6 are in contact with each other, serves as a stripe-shaped current injection region. Additionally, the n-type AlGaN layer 3 and the p-type AlGaN layer 5 each serves as a cladding layer.

The GaN substrate 1 is made of conductive n-type GaN. An n-type electrode 11 is formed on the reverse side of the GaN substrate 1. A p-type electrode 10 is formed on a portion of the transparent electrode 8 where the transparent film 9 is not fowled. The transparent electrode 8 is made of a transparent conductive film of ZnO (zinc oxide), ITO or the like for example, which is transparent, low-absorbent and less reflective with respect to the emission wavelength from the active layer 4. Alternatively, besides ZnO or ITO, materials such as a metal film made of Pd, Au or the like may be used, in which case, the material is deposited extremely thinly to form the transparent electrode 8. Yet, alternatively, a transparent oxide conductive film and a thin metal film may be used by laminating each other. The transparent film 9 composing the ridge stripe portion D is made of $SiO_2$, $ZrO_2$, $Al_2O_3$, SiZr or the like. The ridge stripe portion D according to the present embodiment is a dummy ridge stripe where no current flows. The transparent film 9 may be made of either a conductive film or an insulating film having electrical insulation properties, which is transparent, low-absorbent and less reflective with respect to the emission wavelength from the active layer 4. For example, a transparent resin, which is advantageous in terms of productivity and cost, may be used. Also, the ridge stripe portion D may be made of a material having a smaller refractive index than GaN-based semiconductors, in order for confinement of light.

Figure 9:
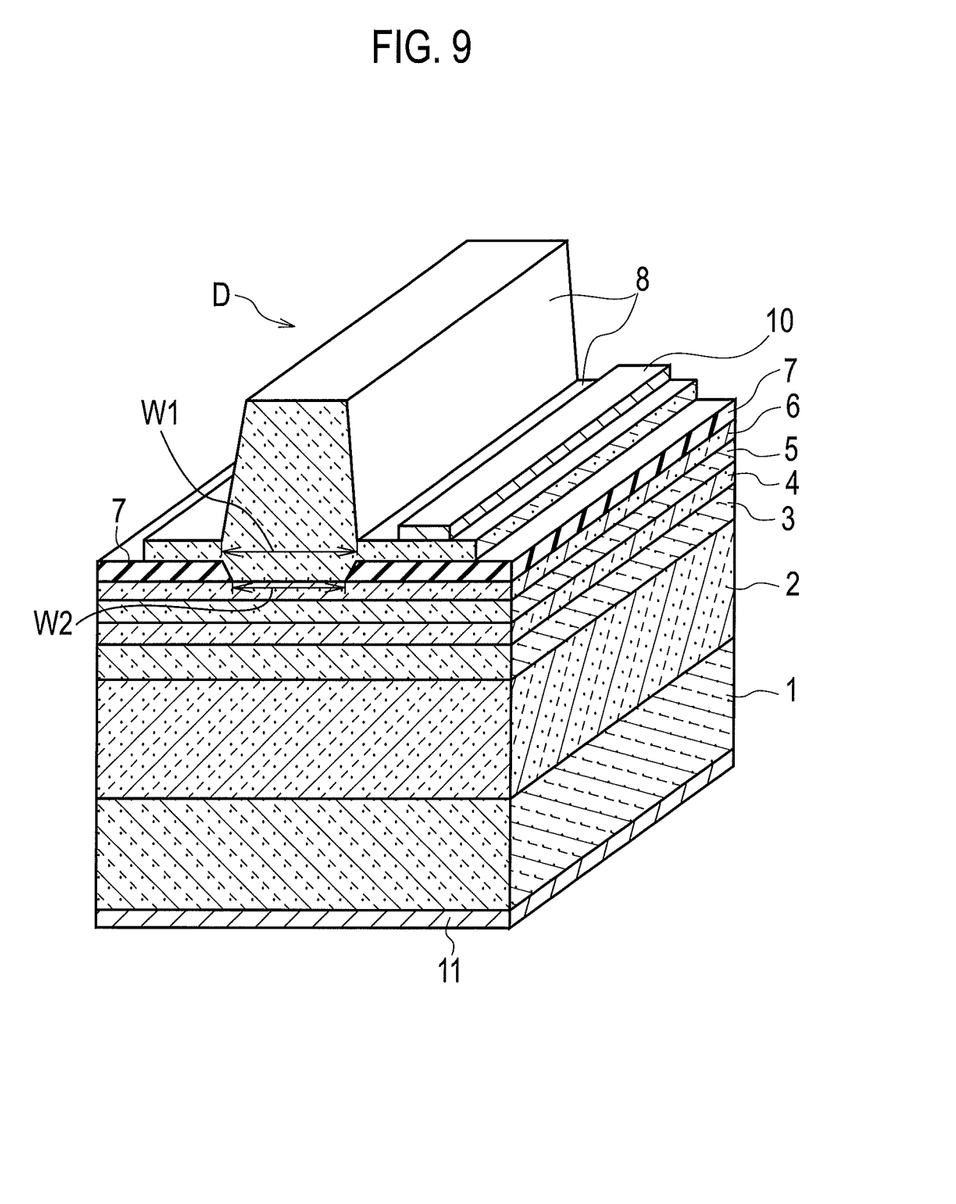
FIG. 9 is a perspective view showing an entire structure of the semiconductor light-emitting device shown in FIG. 1, in which a ridge stripe portion and a transparent electrode are made of the same material.

Alternatively, the ridge stripe portion D may be made of a same transparent conductive material as the transparent electrode 8 as shown in FIG. 9. Since the thickness of the ridge stripe increases in this case, the ridge stripe portion D or the transparent electrode 8 is made of a transparent conductive film such as ZnO and ITO. The ridge stripe portion D causes a refractive index difference in the transverse direction of the active layer 4 to form an optical waveguide. In addition, a front edge surface D1 and an opposite edge surface D2 of the optical waveguide compose an optical resonator, from which amplified light is emitted by stimulated emission.

The active layer 4 is an active layer having a quantum well structure in which the well layer is sandwiched by barrier layers having a band gap larger than the well layer. A structure in which the quantum well structure is multiplexed is the MQW (Multi Quantum Well), that is, a multiple quantum well structure. The active layer 4 may have the SQW (Single Quantum Well) of a single quantum well structure, instead of the MQW.

Assume that maximum transverse width at the bottom of the ridge stripe portion D is W1 and the transverse length of the ridge stripe portion D where the transparent electrode 8 is in contact with the p-type GaN layer 6 is W2. Then, W1 is formed to be equal to or larger than W2 (W1≧W2). For example, the transparent film 9 may be made of $SiO_2$ with the transverse width W1 of about 2 μm. Here, W1 corresponds to the transverse width of the optical waveguide within the active layer 4, and W2 corresponds to the current injection region. Here, for example, the relationship of 3 μm≧W1≧W2 is preferable, as excessively large W1 reduces the spreading of optical beams significantly.

In a conventional structure shown in FIG. 12, a ridge stripe structure is made of a GaN-based semiconductor so that the optical waveguide width and the current injection region are integrally formed, and therefore, can not be formed separately. Accordingly, since the current injection region is dependent on the specification of the optical waveguide, it was difficult to increase the injected current density by current constriction and inverted distribution was less likely to occur in some cases. According to the present invention, sizes of the optical waveguide width W1 and the current injection region width W2 can be set separately, whereby the injected current density can be increased by narrowing the current injection region width W2 so that inverted distribution as a prerequisite of the laser oscillation is likely to occur.

In a nitride semiconductor laser device thus configured, dimensional variation of the p-type AlGaN layer relating to the disposition of the waveguide decreased. First, fluctuation effects during dry etching were eliminated since, unlike a conventional structure shown in FIG. 12, there is no need to control the film thickness t1 by removing a portion of the p-type AlGaN layer 25 by dry etching.

Furthermore, dimensional variation in the crystal growth process is considered to be normally within the range of 10% of the film thickness. Variation of t1 in a conventional structure is 1000 Å equivalent to 10% of 1 μm since the structure needs the overall film thickness of at least 1 μm. According to the present invention, however, aggregate film thickness of the p-type AlGaN layer 5 and the p-type GaN layer 6 can be reduced to not more than 0.3 μm as will be described below. Accordingly, assuming that the aggregate thickness is 10% of 0.3 μm, the dimensional variation decreases down to about 300 Å, less than the dimensional variation of the conventional structure, and laser characteristics are improved.

On the other hand, assume that the resistivity of the p-type GaN-based semiconductor layers is 1 Ω·cm. A conventional structure shown in FIG. 12 needs a ridge stripe shaped approximately 2 μm (transverse width)×1 mm (length in stripe direction)×1 (height or film thickness). For this reason, the resistance value thereof becomes 5Ω, and operating current of 100 mA raises voltage by 0.5V due to resistance of the p-type GaN-based semiconductor layer.

In a structure according to the present invention shown in FIG. 1, however, aggregate film thickness of the p-type AlGaN layer 5 and p-type GaN layer 6 can be made to 0.3 μm as described above. Accordingly, even if the transverse width W2 of the current injection region is 2 μm, which is the same as a conventional structure, the size of the stripe-shaped current injection region is 2 μm (transverse width)×1 mm (length in stripe direction)×0.3 μm (height or film thickness) with the resistance value of 1.5Ω. Accordingly, operating current of 100 mA raises voltage by 0.15V, suppressing increase of the driving voltage as compared with the conventional structure.

Furthermore, shortening of the lifetime due to internal heat generation can be prevented by lowering the resistance value of the p-type layer. According to the present invention, the film thickness of p-type nitride semiconductor layers on the active layer can be reduced down to, for example, not more than 1 μm, more particularly, not more than 0.5 μm, and not less than 0.1 μm, so that the resistance due to p-type layers can be fully reduced to sufficiently confine light.

Incidentally, the structure of the semiconductor light-emitting device according to the present invention is not limited to nitride semiconductors but also applicable to InGaAlP-based compound semiconductors and the like used for the red laser or the like. However, a semiconductor light-emitting device composed of nitride semiconductors has a problem in that resistance of p-type semiconductor layers is particularly higher than other compound semiconductors. For this reason, to confine light by controlling the effective refractive index difference, a film thickness of about 1 μm is necessary to reduce resistance, even in the case, for example, where a film thickness of about 2 μm is necessary for a p-type semiconductor layer. In this case, however, light is not sufficiently confined, and thus laser characteristics fluctuate. A structure of the semiconductor light-emitting device according to the present invention provides specific optical confinement effects and reduces the resistance value of p-type semiconductor layers. Thus, the structure of the present invention is particularly effective for a case where a semiconductor light-emitting device is composed of nitride semiconductors.

Figure 10:
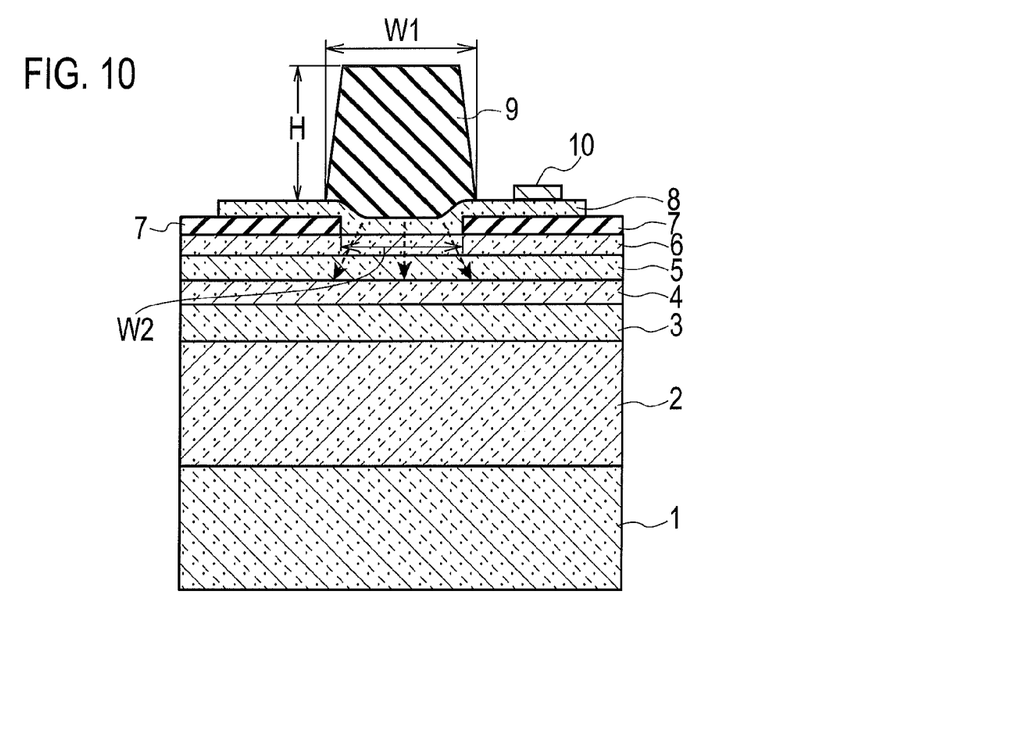
FIG. 10 is a schematic diagram showing the flow of carriers flowing from the current injection region.

FIG. 10 is a cross sectional view of FIG. 1 (the n-type electrode 11 is not shown), in which dashed arrows schematically indicate a flow of carriers flowing from the current injection region. Herewith, flow of carriers injected through the current injection region spreads toward the active layer 4 as indicated by dashed arrows in the figure. Here, height H of the ridge stripe portion D is preferably within the range of 3 μm≧H≧0.4 μm. The lower limit of the height H is thus set since optical waveguide is less likely to occur in the ridge stripe portion D if the height is too low, while the upper limit of the height is thus set since costs are increased and productivity drops if the height H is too high.

Relationship between W1 and W2 is preferably set to be (W1−W2)≧0.2×W2, that is, W1≧1.2×W2, since carriers shown in FIG. 10 tend to spread in right and left directions respectively by 0.1 times the transverse width W2 of the current injection region. Accordingly, the light-emitting region of the active layer 4 is conceived to be approximately 1.2×W2, and W1 preferably has a margin as described above in order to take in the light and make waveguide of the light in the ridge stripe D. On the assumption of the case described above, the insulating film 7 is preferably made of a material which is transparent, low-absorbent and less reflective with respect to the light-emitting wavelength from the active layer 4.

Next, a fabrication method of the semiconductor light-emitting device shown in FIG. 1 is described below by referring to FIG. 2 to FIG. 6. First, the GaN substrate 1 as a growth substrate is placed in the MOCVD (Metalorganic Chemical Vapor Deposition) apparatus. Then, while pouring hydrogen gas, the MOCVD apparatus is heated up to about 1,050° C. for thermal cleaning of the GaN substrate 1. While keeping the temperature, a reactant gas used as an N-type material such as, for example, $NH_3$, and a material gas for Ga, such as, for example, trimethyl gallium (TMGa) and then silane ($SiH_4$) as an n-type dopant gas are supplied to grow the n-type GaN layer 2 to about 5 μm thickness.

Subsequently, trimethyl aluminum (TMA), a material gas of the Al atomic element, is also supplied to grow the n-type AlGaN layer 3 to about 0.5 μm thickness. Then, supply of TMGa, TMA and silane is stopped, and temperature of the substrate is lowered to 700° C. to 800° C. in a mixture gas of ammonia and hydrogen, and then triethyl gallium (TEGa) is supplied to form barrier layers composed of undoped GaN of the active layer 4. Then, trimethyl indium (TMin) is supplied to form the InGaN well layer. Then, laminating of the GaN barrier layer and the InGaN well layer is repeated to obtain a multiple quantum well structure. The active layer 4 is grown for example, to about 0.1 μm thickness.

Figure 2:
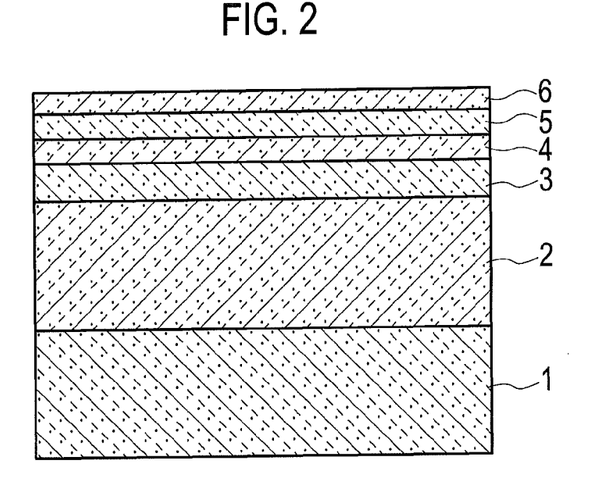
FIG. 2 is a drawing showing a fabrication process of the semiconductor light-emitting device shown in FIG. 1.

Following the growth of the active layer 4, growth temperature is raised up to 1,020° C. to 1,040° C., and trimethyl gallium (TMGa) as a material gas of the Ga atomic element, ammonia ($NH_3$) as a material gas of the nitrogen atomic element, trimethyl aluminum (TMA) as a material gas of the Al atomic element, and $CP_2MG$ (Bis(cyclopentadienyl)magnesium) as a dopant material of the p-type impurity Mg are supplied to grow the p-type AlGaN layer 5, for example, to 0.15 μm thickness. Then, while keeping the growth temperature, supply of TMA is stopped to grow the p-type GaN layer 6, for example, to about 0.1 μm thickness. Thus, a laminated composite in which the GaN substrate 1 through the p-type GaN layer 6 are laminated is formed as shown in FIG. 2.

Here, unlike the conventional structure, there is no need to form the ridge stripe structure by dry etching the p-type GaN-based semiconductor layer. Also, since the p-type GaN-based semiconductor layer may be formed just to serve as a cladding layer or a contact layer, the aggregate film thickness of p-type GaN-based semiconductor layers can be reduced down to not more than 0.3 μm. P-type GaN-based semiconductor layers according to the present embodiment are the p-type AlGaN layer 5 and the p-type GaN layer 6, with the aggregate film thickness of 0.25 μm as described above.

To form each of semiconductor layers, a desired conductive semiconductor layer of a desired composition can be formed to a required film thickness by supplying reactant gases associated with components of semiconductor layers such as triethyl gallium (TEGa), trimethyl gallium (TMG), ammonia ($NH_3$), trimethyl aluminum (TMA) and trimethyl indium (TMIn), silane ($SiH_4$) as a dopant gas required for the n-type and $CP_2Mg$ (Bis(cyclopentadienyl) magnesium) as a dopant gas required for the p-type, in addition to hydrogen or nitrogen as carrier gas and then growing sequentially within the temperature range of 700° C. to 1,200° C.

Figure 3:
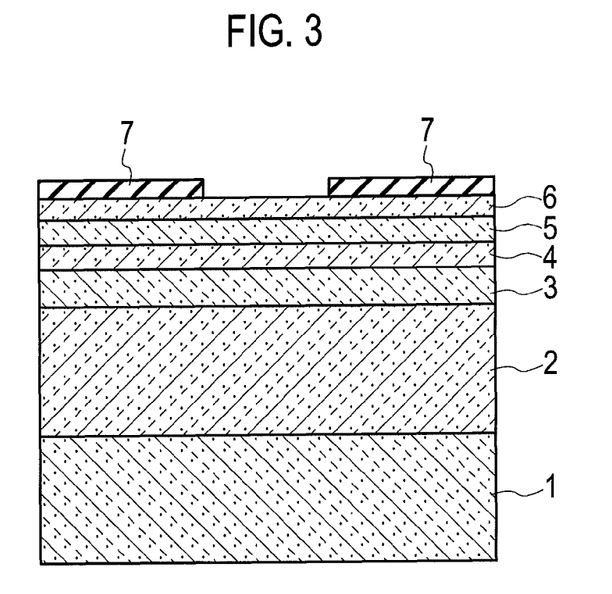
FIG. 3 is a drawing showing a fabrication process of the semiconductor light-emitting device shown in FIG. 1.

Then, using the plasma CVD method, $SiO_2$ with the film thickness of about 2,000 Å is formed on the p-type GaN layer 6 as the insulating layer 7. Using the photolithographic technique, wet etching with buffered hydrogen fluoride is performed on $SiO_2$ on a rectangular region covered by the width W2 of 1 μm and the length in the stripe direction of 1 mm to form the current injection region. Thus, the insulating film 7, from where the rectangular region of, for example, 1 μm×1 mm is removed, is formed as shown in FIG. 3.

Figure 4:
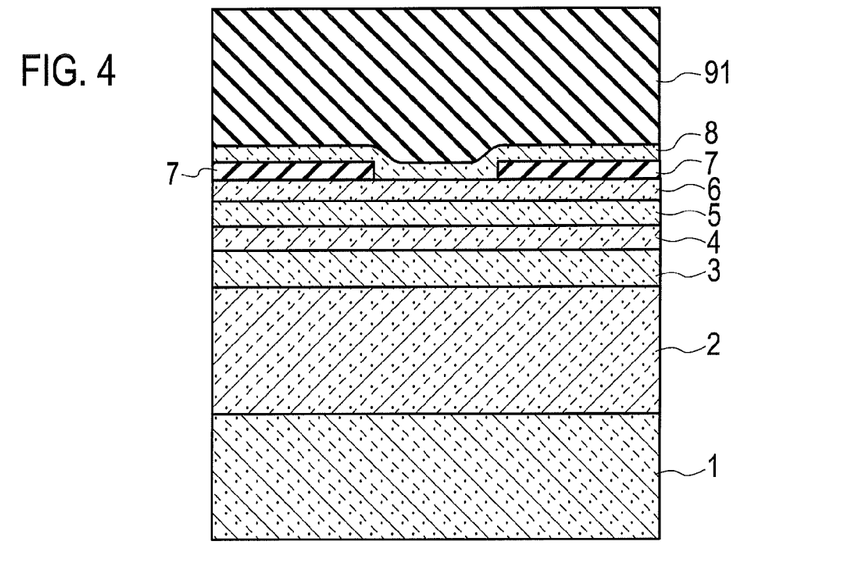
FIG. 4 is a drawing showing a fabrication process of the semiconductor light-emitting device shown in FIG. 1.

Then, ZnO is deposited as the transparent electrode 8 by laser deposition or EB (electronic beam) deposition. The transparent electrode 8 contacts the p-type GaN layer 6 at a region from where the insulating film 7 is removed, while, in other regions, the transparent electrode 8 is formed on the insulating film 7. Having especially excellent ohmic contact property on GaN-based semiconductors, ZnO can be made in ohmic contact with the p-type GaN layer 6. A transparent material 91 made of $SiO_2$ or the like is formed to a thickness of about 2 μm on the transparent electrode 8 by plasma CVD to form a laminated composite as shown by FIG. 4.

Figure 5:
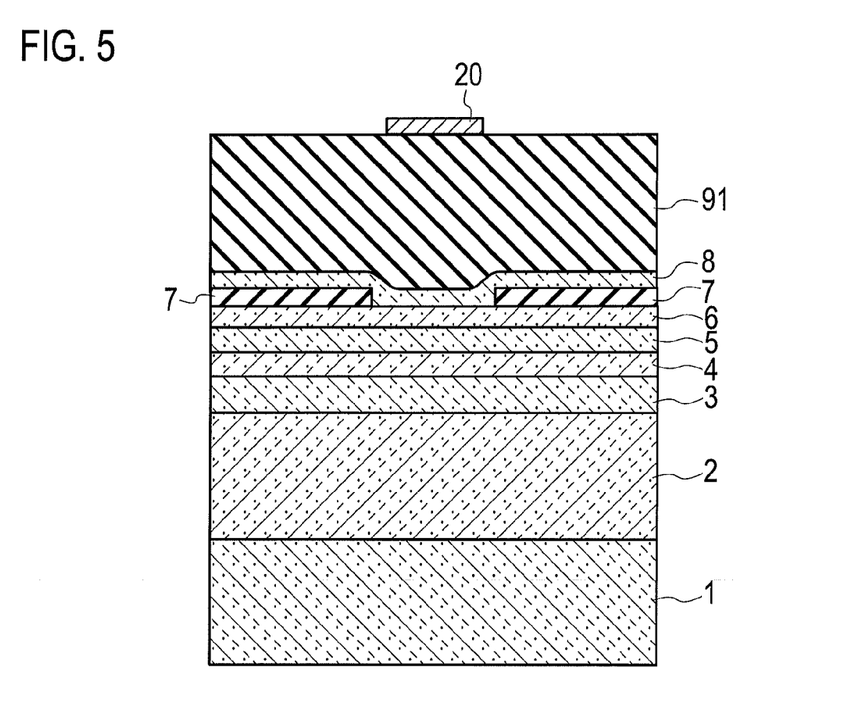
FIG. 5 is a drawing showing a fabrication process of the semiconductor light-emitting device shown in FIG. 1.

Then, as shown in FIG. 5, the metallic film 20, which is made of Ni (nickel) for example, is farmed on the transparent material 91 to form a stripe shape with the transverse width of Ni equal to or larger than the width W2 at the opening of the insulating film 7. According to the present embodiment, the transverse width of Ni is set to 2 μm, larger than the width W2, and the length in the stripe direction to 1 mm. The metallic film is formed by deposition.

Figure 6:
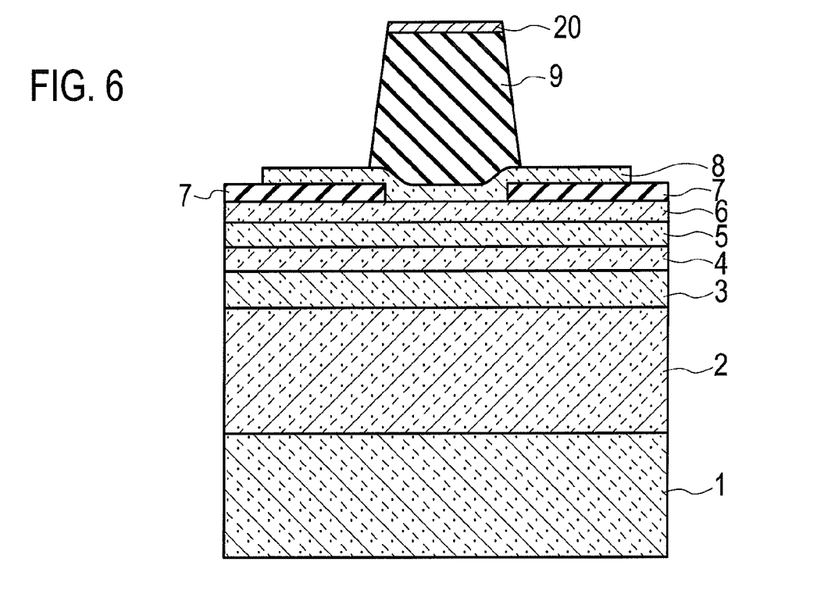
FIG. 6 is a drawing showing a fabrication process of the semiconductor light-emitting device shown in FIG. 1.

Subsequently, with the metallic film 20 as a mask, the transparent material 91 is mesa etched by dry etching to form a ridge stripe shape made of the transparent film 9 as shown in FIG. 6. Then, portions on both ends of the transparent electrode 8 are removed by etching.

Here, to form the p-type electrode 10 over the transparent electrode 8 as shown in FIG. 1, the metallic film 20 is removed, and a metallic multilayered film of Ti/Au as the p-type electrode 10 for example is formed to a film thickness of 500 Å or 8000 Å respectively by deposition or sputtering. On the other hand, the n-type electrode 11 is formed by depositing or sputtering a metallic multilayered film of Ti/Al for example to a thickness of 500 Å or 8,000 Å respectively.

Figure 7:
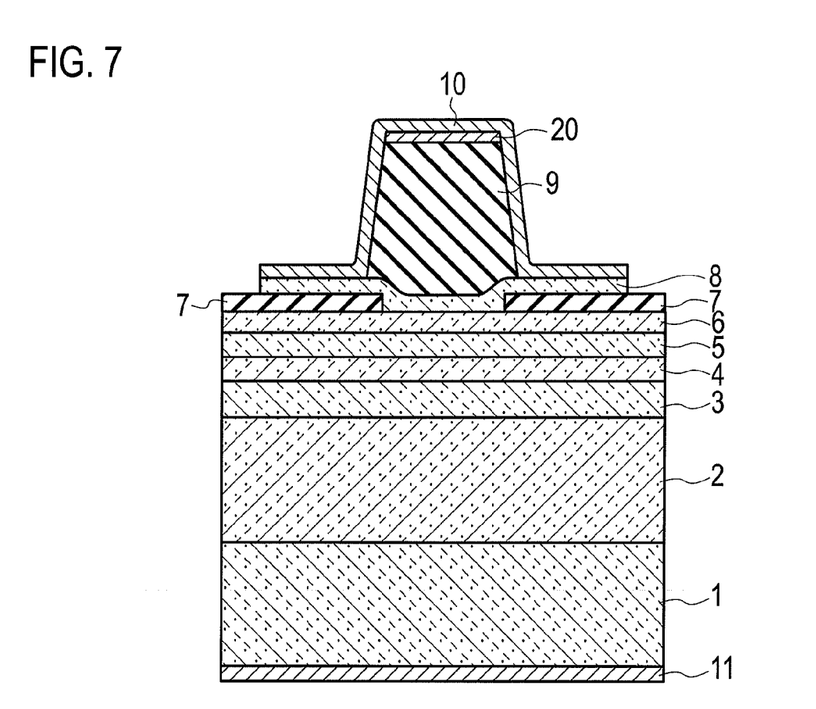
FIG. 7 is a drawing showing a cross section structure of a semiconductor light-emitting device having a p-electrode structure different from the one shown in FIG. 1.

Alternatively, the p-type electrode 10 may be formed as shown in FIG. 7, in which case, the p-type electrode 10 is formed by removing edge surfaces D1 and D2 from upper and side surfaces of the ridge stripe portion and upper surface of the transparent electrode 8 while leaving the metallic film 20. In this case, a material same as the case shown in FIG. 1 may be used to form the p-type electrode 10 and n-type electrode 11 to the same thickness.

As shown in FIG. 1 and FIG. 7, the p-type electrode 10 of the p-side electrode is formed at least on a region of the transparent electrode 8 where the transparent film 9 forming the ridge stripe portion D is not formed. In other words, the p-type electrode 10 is formed in contact with at least a portion of a side of the transparent electrode 8 exposed to both sides sandwiching the ridge stripe D. When FIG. 1 and FIG. 7 are compared, however, FIG. 7 shows that the p-type electrode 10 is formed entirely in contact with left and right sides of the transparent electrode 8 across the ridge stripe portion D. This indicates that current density becomes symmetrical in the current injection region W2 in the case of FIG. 7, while current density may not become symmetrical in the current injection region W2 and thereby may affect laser characteristics in the case of FIG. 1.

Also, when contact resistance between the transparent electrode 8 and the p-type electrode 10 does not become lower, the configuration shown in FIG. 7 may generate lower voltage since the configuration thereof provides a larger contact area between the transparent electrode 8 and p-type electrode 10 than that shown in FIG. 1. If radiation ratio of the p-type electrode 10 to an entire device is large, the configuration shown in FIG. 7 will have better radiation performance.

Incidentally, if many laser devices having such a ridge stripe as shown in FIG. 1 and FIG. 7 are formed on a common substrate, such laser devices must be chipped by cleaving.

Figure 8:
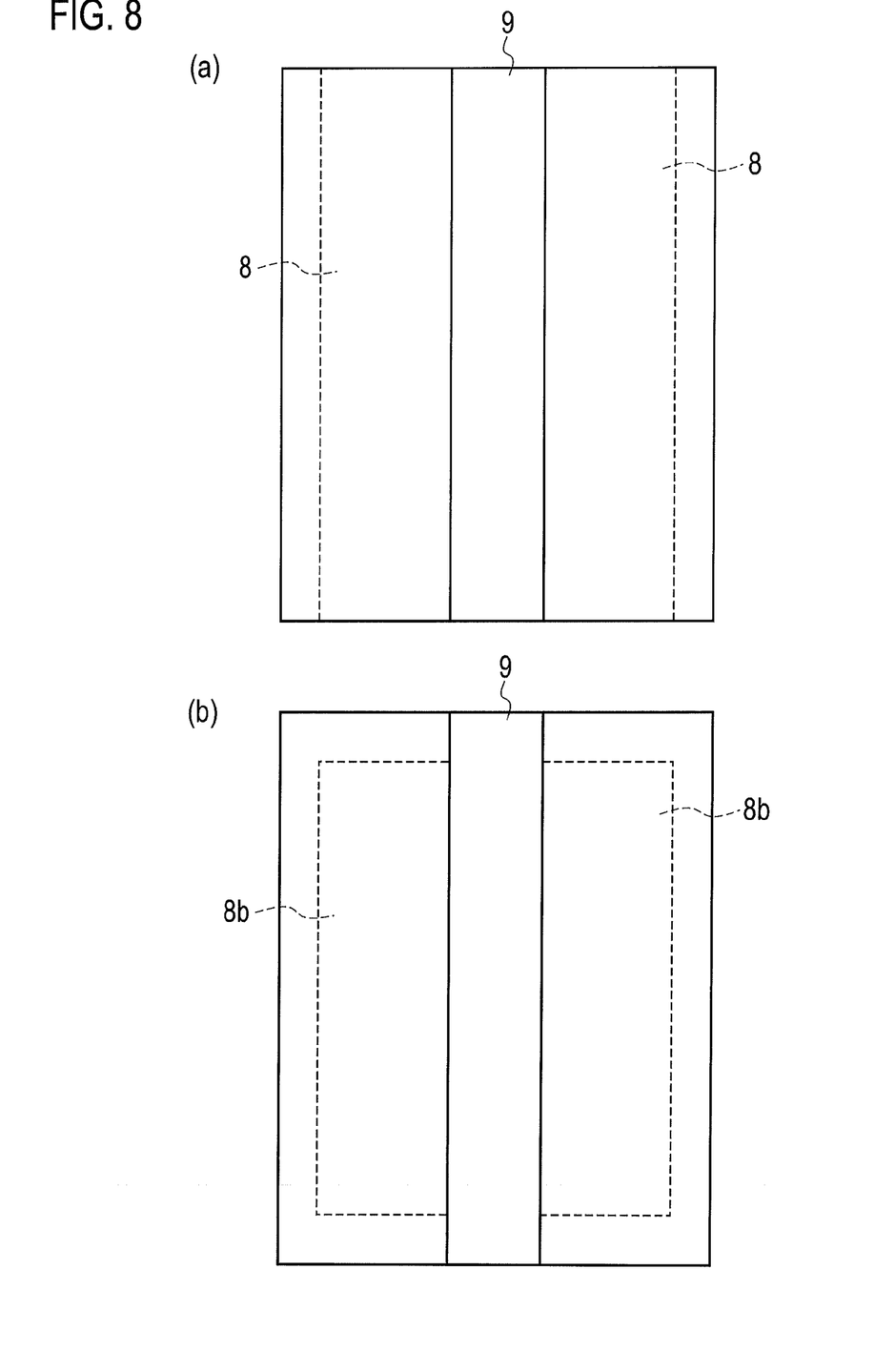
FIG. 8 is a plain view of semiconductor light-emitting devices in which transparent electrodes are disposed at different regions.

Top view of the nitride semiconductor laser devices thus fabricated is shown in FIG. 8. FIG. 8(a) shows a plain view of the nitride semiconductor laser device shown in FIG. 1 or FIG. 7 with the p-type electrode 10 removed. Although current is injected from the p-type electrode through the transparent electrode 8, radiation performance at edge surfaces of the semiconductor laser chip is generally poor. When the transparent electrode 8 is formed entirely up to edge surfaces D1 and D2 serving as the resonator, current flows up to the edge surfaces and generates heat. This heat tends to cause melting and COD (Catastrophic Optical Damage) destruction, which may result in deterioration in the edge surfaces. The deterioration of the edge surfaces may decrease the reflection ratio of the edge surfaces and disable laser operations.

In consideration of the foregoing, the transparent electrode 8b may be formed to be retracted from the edge surfaces D1 and D2 by a specific distance, so that current does not flow up to distanced edge surface regions. Thus, heat generation can be suppressed and deterioration of the edge surfaces can be prevented.

Figure 11:
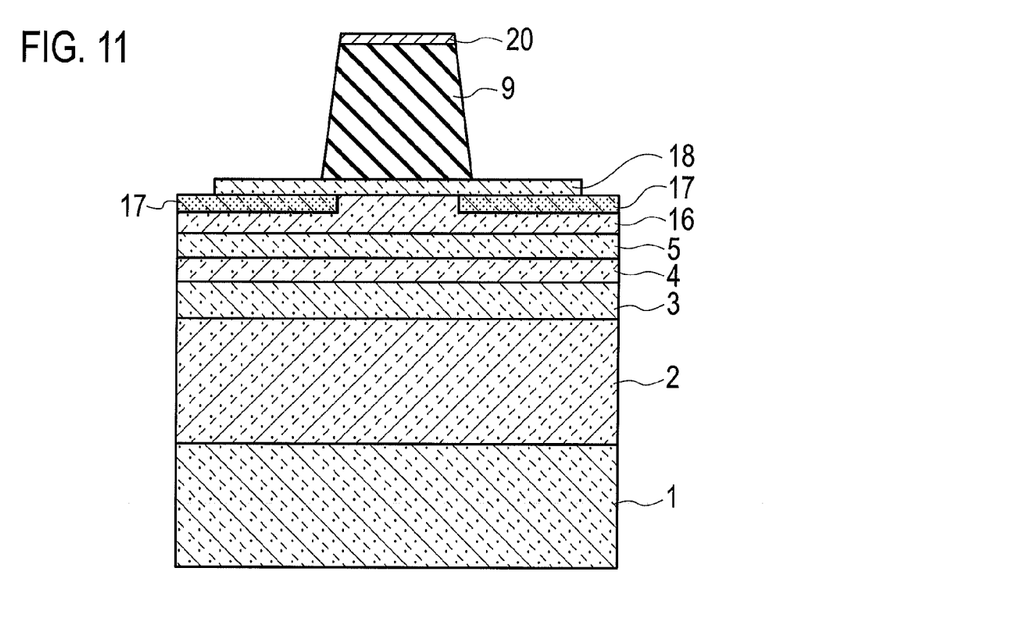
FIG. 11 is a drawing showing a cross section structure of a semiconductor light-emitting device in which a portion of the p-type GaN layer is inverted into an n-type inversion layer.

The present invention is not limited to the embodiment described above but also applicable to a structure shown in FIG. 11. FIG. 6 is a drawing showing a fabrication process of a semiconductor light-emitting device shown in FIG. 1, while FIG. 11 shows a structure corresponding to a process diagram shown in FIG. 6. For example, instead of the insulating film 7 shown in FIG. 6, a portion of the p-type GaN layer 16 can be inversely formed into the n-type GaN layer 17 by plasma ion impact, and the transparent electrode 18 is disposed over surfaces of the n-type GaN layer 17 and the p-type GaN layer 16. Current may be constricted by such n-type and p-type bonding. Yet, as another alternative, the n-type GaN layer 17 may be formed in such a manner that a region corresponding to the current injection region of the p-type GaN layer 16 is covered with a mask (not shown), and that an n-type impurity such as Si, for example, is injected into a portion of the p-type GaN layer 16, thereby to achieve current constriction.

The invention claimed is:

1. A semiconductor light-emitting device, comprising;
    a laminated structure in which an active layer is disposed between one of a plurality of p-type semiconductor layers and a first n-type semiconductor layer;
    a transparent electrode formed on an outermost one of the semiconductor layers of the plurality of p-type semiconductor layers;
    a ridge stripe portion formed on the transparent electrode and configured to form an optical waveguide; and
    a p-type electrode formed in contact with at least a portion of one of surfaces of the transparent electrode exposed on both sides of the ridge stripe portion, wherein
    the transparent electrode and the ridge stripe portion are transparent with respect to the emission wavelength of the active layer, and
    the outermost p-type semiconductor layer has a step portion and the step portion has a current restriction region.

2. The semiconductor light-emitting device according to claim 1, wherein the p-type semiconductor layers, the first n-type semiconductor layer and the active layer are made of nitride.

3. The semiconductor light-emitting device according to claim 1, wherein the ridge stripe portion is made of the same material as the transparent electrode.

4. The semiconductor light-emitting device according to claim 1, wherein the current restriction region is comprised of a second n-type semiconductor layer.

5. The semiconductor light-emitting device according to claim 4, wherein the second n-type semiconductor layer is formed by inverting a conductivity type of a portion of the outermost p-type semiconductor layer.

6. The semiconductor light-emitting device according to claim 4, wherein the plurality of p-type semiconductor layers include a first p-type semiconductor layer disposed on the active layer and the outermost p-type semiconductor layer disposed on the first p-type semiconductor layer.

7. The semiconductor light-emitting device according to claim 1, wherein the p-type electrode is formed in contact with the entire exposed surfaces of the transparent electrode.

8. The semiconductor light-emitting device according to claim 1, wherein the transparent electrode is formed inward of an edge surface of the optical waveguide.

9. The semiconductor light-emitting device according to claim 1, wherein a region where the transparent electrode and the outermost p-type semiconductor layer are in contact with each other is a current injection region.

* * * * *